(12) United States Patent
Hsieh

(10) Patent No.: US 9,377,354 B2
(45) Date of Patent: Jun. 28, 2016

(54) MOTION SENSOR AND PACKAGING METHOD THEREOF

(71) Applicant: LITE-ON SEMICONDUCTOR CORPORATION, New Taipei (TW)

(72) Inventor: Ming-Hsun Hsieh, Kaohsiung (TW)

(73) Assignee: Dyna Image Corporation, Hsin-Tien Dist., New Taipei (TW)

( * ) Notice: Subject to any disclaimer, the term of this patent is extended or adjusted under 35 U.S.C. 154(b) by 53 days.

(21) Appl. No.: 14/264,038

(22) Filed: Apr. 28, 2014

(65) Prior Publication Data

US 2014/0319328 A1 Oct. 30, 2014

Related U.S. Application Data

(60) Provisional application No. 61/817,306, filed on Apr. 29, 2013.

(30) Foreign Application Priority Data

Dec. 25, 2013 (CN) .......................... 2013 1 0727571

(51) Int. Cl.
*G01J 1/42* (2006.01)
*H01L 25/00* (2006.01)
(Continued)

(52) U.S. Cl.
CPC .................. *G01J 1/42* (2013.01); *G01S 7/4813* (2013.01); *G01S 17/50* (2013.01); *G06F 3/0304* (2013.01); *G06F 3/0354* (2013.01); *G06F 3/03547* (2013.01); *G06F 13/24* (2013.01); *G06K 9/60* (2013.01); *G06T 5/008* (2013.01); *H01L 25/167* (2013.01); *H01L 25/50* (2013.01);

(Continued)

(58) Field of Classification Search
CPC .......... G01J 1/42; G01S 7/4813; G01S 17/50; G06F 3/0304; G06F 3/0354; G06F 3/03547; G06F 13/24; G06K 9/60; G06T 5/008; H01L 25/167; H01L 25/50; H01L 31/02327; H05K 13/046
USPC .................. 250/221, 239, 551, 338.1; 257/82
See application file for complete search history.

(56) References Cited

U.S. PATENT DOCUMENTS 4,866,571 A * 9/1989 Butt ...................... H01L 23/047
174/16.3
5,317,149 A 5/1994 Uebbing
(Continued)

FOREIGN PATENT DOCUMENTS

DE 2146 377 3/1973
DE 10 2007 023 893 A1 11/2008

OTHER PUBLICATIONS

SFH 7773 (IR-LED + Proximity Sensor + Ambient Light Sensor), Application note, preliminary, Dec. 12, 2011, pp. 1-23, Opto Semiconductors, OSRAM, XP055111379.

*Primary Examiner* — Renee D Chavez
(74) *Attorney, Agent, or Firm* — Winston Hsu; Scott Margo

(57) ABSTRACT

A motion sensor includes: a substrate, which includes a plurality of lead frame layers and a plurality of ceramic layers; a light source, disposed on the substrate, for emitting light; a sensing device, disposed on the substrate, for receiving the light to perform motion sensing; a cover, for fixing and protecting the light source and the sensing device; and an adhesive, for gluing the cover to the substrate, the adhesive including a component capable of blocking the light; wherein the light is infrared light, visible light or ultraviolet light.

18 Claims, 5 Drawing Sheets

(51) Int. Cl.

| | |
|---|---|
| *H01L 25/16* | (2006.01) |
| *H05K 13/04* | (2006.01) |
| *H01L 31/0232* | (2014.01) |
| *G06F 3/0354* | (2013.01) |
| *G06K 9/60* | (2006.01) |
| *G06T 5/00* | (2006.01) |
| *G06F 13/24* | (2006.01) |
| *G01S 7/481* | (2006.01) |
| *G01S 17/50* | (2006.01) |
| *G06F 3/03* | (2006.01) |
| *H01L 27/146* | (2006.01) |

(52) U.S. Cl.
CPC ........ *H01L31/02327* (2013.01); *H05K 13/046* (2013.01); *G01J 2001/4295* (2013.01); *H01L 27/14618* (2013.01); *H01L 27/14625* (2013.01); *H01L 2224/05554* (2013.01); *H01L 2224/48091* (2013.01); *H01L 2224/48247* (2013.01)

(56) References Cited

U.S. PATENT DOCUMENTS

| | | | |
|---|---|---|---|
| 7,046,344 B2 * | 5/2006 | Yamamoto | G01C 3/08 356/4.01 |
| 7,103,693 B2 | 9/2006 | Anand | |
| 7,309,855 B2 | 12/2007 | Nagasaka | |
| 7,348,957 B2 | 3/2008 | Cui | |
| 7,617,980 B2 | 11/2009 | Saxena | |
| 7,763,841 B1 | 7/2010 | McEldowney | |
| 7,842,957 B2 | 11/2010 | Goh | |
| 8,304,850 B2 | 11/2012 | Lazarov | |
| 8,604,436 B1 | 12/2013 | Patel | |
| 8,619,267 B2 | 12/2013 | Wong | |
| 8,735,795 B2 | 5/2014 | Qiao | |
| 2006/0237540 A1 | 10/2006 | Saxena | |
| 2008/0012085 A1 | 1/2008 | Cheng | |
| 2008/0122803 A1 | 5/2008 | Izadi | |
| 2009/0034081 A1 | 2/2009 | Chu | |
| 2009/0045498 A1 | 2/2009 | Braden | |
| 2009/0256931 A1 | 10/2009 | Lee | |
| 2010/0171027 A1 * | 7/2010 | Yun | H03K 17/941 250/221 |
| 2010/0181578 A1 | 7/2010 | Li | |
| 2011/0057102 A1 | 3/2011 | Yao | |
| 2011/0068270 A1 * | 3/2011 | Shin | G01J 3/10 250/338.1 |
| 2011/0204209 A1 | 8/2011 | Barrows | |
| 2011/0204233 A1 | 8/2011 | Costello | |
| 2011/0248172 A1 | 10/2011 | Rueger | |
| 2011/0254864 A1 | 10/2011 | Tsuchikawa | |
| 2011/0260176 A1 * | 10/2011 | Onoe | A61B 5/0261 257/79 |
| 2012/0080764 A1 | 4/2012 | Xue | |
| 2012/0256892 A1 | 10/2012 | Hung | |
| 2012/0262421 A1 | 10/2012 | Kao | |
| 2012/0265471 A1 | 10/2012 | Hess | |
| 2012/0284442 A1 | 11/2012 | Card | |
| 2013/0044380 A1 | 2/2013 | Shen | |
| 2013/0093708 A1 | 4/2013 | Annett | |
| 2013/0341650 A1 | 12/2013 | Peng | |
| 2014/0014839 A1 | 1/2014 | Chang | |
| 2014/0118257 A1 | 5/2014 | Baldwin | |
| 2014/0319348 A1 | 10/2014 | Hsieh | |
| 2014/0325108 A1 | 10/2014 | Zhan | |
| 2014/0325109 A1 | 10/2014 | Zhan | |
| 2014/0361200 A1 * | 12/2014 | Rudmann | H01L 23/053 250/578.1 |
| 2015/0028360 A1 | 1/2015 | Tu | |

* cited by examiner

MOTION SENSOR AND PACKAGING METHOD THEREOF

CROSS REFERENCE TO RELATED APPLICATIONS

This application claims the benefit of U.S. Provisional Application No. 61/817,306, which was filed on Apr. 29, 2013 and titled "3D-Motion Gesture/Proximity Detection Module Sensor (MGPS)", the contents of which are incorporated herein by reference.

BACKGROUND OF THE INVENTION

1. Field of the Invention

The present invention relates to a motion sensor and a packaging method thereof, and more particularly, to a motion sensor having a ceramic package structure and a packaging method thereof.

2. Description of the Prior Art

With advancements in technology, modern computer systems can be used as video gaming and entertainment systems, whereas computer systems in the past only had simple functions such as word processing. The computer system has therefore become one of the most important devices in our modern society. To further improve the computer system's usefulness and functionality, technology to integrate input devices for interface control is also continuously being developed.

Many computer systems are equipped with diversified functions, and therefore require various sensing devices which can perform detection on peripheral environments, in order to perform corresponding applications. A motion sensor is capable of converting a movement of a user into a signal, to thereby allow an electronic device to control the movement of a cursor or pointer on a display screen. This function may be applied together with a graphical user interface on the display screen to select objects on the display screen and perform control functions accordingly, allowing the user to interact with the computer system via the device. Enhancing the stability and conductivity of the motion sensor has therefore become a target of the industry.

SUMMARY OF THE INVENTION

It is an objective of the present invention to provide a motion sensor having a ceramic package structure and a packaging method thereof capable of enhancing the stability and conductivity of the motion sensor.

The present invention discloses a motion sensor. The motion sensor comprises a substrate, which includes a plurality of lead frame layers and a plurality of ceramic layers; a light source, disposed on the substrate, for emitting light; a sensing device, disposed on the substrate, for receiving the light to perform motion sensing; a cover, for fixing and protecting the light source and the sensing device; and an adhesive, for gluing the cover to the substrate, including a component capable of blocking the light; wherein the light is infrared light, visible light or ultraviolet light.

The present invention further discloses a packaging method for a motion sensor. The packaging method comprises laying a plurality of lead frame layers and a plurality of ceramic layers to generate a substrate; disposing a light source on the substrate for emitting light; disposing a sensing device on the substrate for receiving the light to perform motion sensing; laying an adhesive which comprises a component capable of blocking the light; and overlaying a cover and gluing the cover to the substrate via the adhesive, for protecting the light source and the sensing device; wherein the light is infrared light, visible light or ultraviolet light.

These and other objectives of the present invention will no doubt become obvious to those of ordinary skill in the art after reading the following detailed description of the preferred embodiment that is illustrated in the various figures and drawings.

DETAILED DESCRIPTION

Ceramics are widely used in semiconductor processes such as the ceramic substrate or ceramic packaging. They have several advantages including high mechanical strength, high isolation, large heat resistance, high chemical stability and strong circuit adhesive force. Due to their large heat resistance and high conductivity, the ceramic packaging is widely applied in light emitting diode (LED) processes. The present invention uses the ceramic packaging technology for motion sensors, in order to enhance the stability and conductivity thereof.

Figure 1:
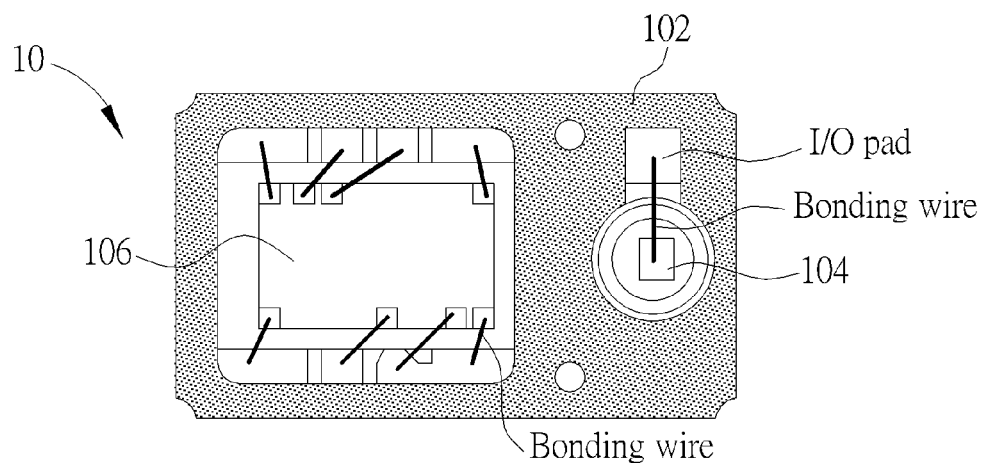
FIG. 1 is a section diagram of a motion sensor according to an embodiment of the present invention.

Please refer to FIG. 1, which is a section diagram of a motion sensor 10 according to an embodiment of the present invention. The motion sensor 10 includes a substrate 102, a light source 104 and a sensing device 106. The substrate 102 is composed of a plurality of lead frame layers and a plurality of ceramic layers. The light source 104, disposed on the substrate 102, is utilized for emitting light. The sensing device 106, also disposed on the substrate 102, is utilized for receiving light to perform motion sensing. The sensing device 106 is illustrated as a chip in FIG. 1, and is connected to I/O pads on the substrate 102 via bonding wires, to perform signal transmission. The sensing device 106 is mainly utilized for controlling the operations of the motion sensor 10, and may be disposed in the motion sensor 10 with a chip or in other forms, which are not limited herein. In an embodiment, the operations of the light source 104 are further driven by a driver. Similarly, the driver may also be realized in a chip and connected to the I/O pads on the substrate 102 via bonding wires, to perform signal transmission. All of the bonding wires and I/O pads used on the substrate 102 may be realized by conductive materials such as gold, copper or aluminum.

Figure 2A:
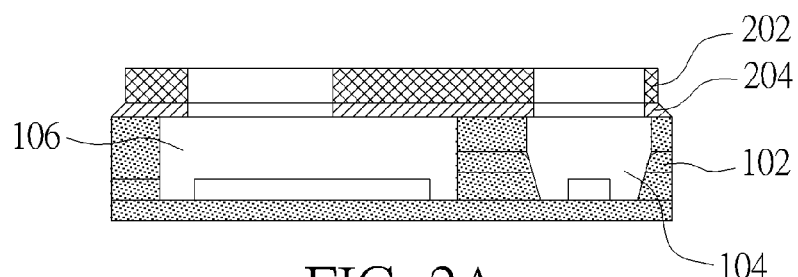
FIG. 2A to FIG. 2C are schematic diagrams illustrating a side view, top view and bottom view, respectively, of the motion sensor shown in FIG. 1.
Figure 2B:
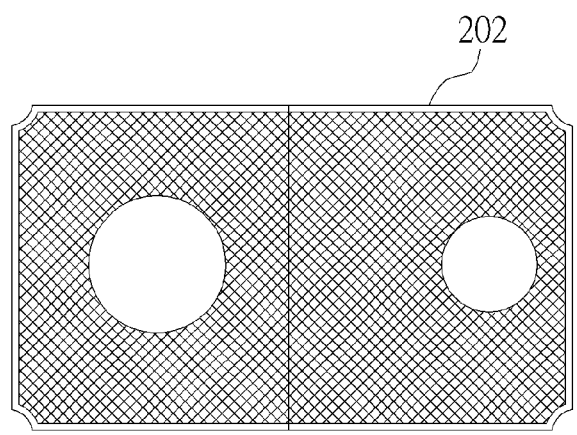

When the motion sensor 10 is in operation, the light source 104 may emit light, which is then reflected by external objects and subsequently received by the sensing device 106. With the difference in locations and shapes of the external objects, different reflection results will be obtained, which can then be used to detect movements and actions of the objects. Please refer to FIG. 2A to FIG. 2C, which are schematic diagrams illustrating a side view, top view and bottom view, respectively, of the motion sensor 10. As shown in FIG. 2A, a side view of the substrate 102, the light source 104 and the sensing device 106 of the motion sensor 10 are illustrated. The substrate 102 is composed by overlapping a plurality of lead frame layers and a plurality of ceramic layers in an interleaved manner. In an embodiment, the substrate 102 includes N lead frame layers and N ceramic layers, where the first lead frame layer is laid as a bottom, the first ceramic layer is overlaid on this bottom, the second lead frame layer is laid on top, and then the second ceramic layer is laid on top of that. When the $N^{th}$ lead frame layer is laid, the $N^{th}$ ceramic layer is laid on top. These layers are then combined via thermocompression.

In the motion sensor 10, a cover 202 is laid over the substrate 102. The cover 202, which is capable of fixing and protecting the light source 104 and the sensing device 106, may be composed of ceramics or ceramic compounds. The cover 202 includes two holes, which are respectively located over the light source 104 and the sensing device 106. A lens is disposed in each hole, wherein one lens provides a light emitting path for the light source 104 and protects the light source 104, and the other provides a light receiving path for the sensing device 106 and protects the sensing device 106.

Please note that the cover 202 is glued to and fixed on the substrate 102 via an adhesive 204, and the adhesive 204 should include a component capable of blocking the light emitted by the light source 104 and light with the same wavelength. The operations of the sensing device 106 performing object sensing are accomplished by detection of light; hence, the sensing device 106 is sensitive to any variations in ambient light. The adhesive 204 has to block the light leaking from the light source 104, in order to prevent this light from interfering with the sensing results of the sensing device 106. In this embodiment, the light emitted by the light source 104 may be of any wavelength and can therefore include infrared light, visible light or ultraviolet light, but is not limited herein. The lens located in the hole may be implemented by any material that can allow the light emitted by the light source 104 to pass, such as plastic. The lens has to be glued over the light source 104 or the sensing device 106 via adhesives which are pervious to light, such as silicone, epoxy or ultraviolet curable adhesive.

Figure 2C:
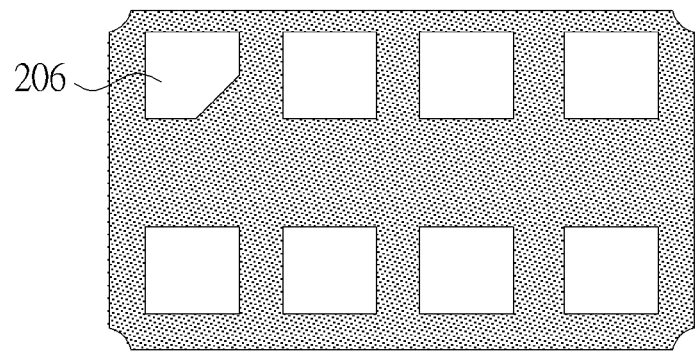

Please refer to FIG. 2C, which illustrates a bottom view of the motion sensor 10. Pads 206 are spread in the bottom of the motion sensor 10, and may be connected to external devices such as a printed circuit board (PCB) for signal transmission.

Figure 3:
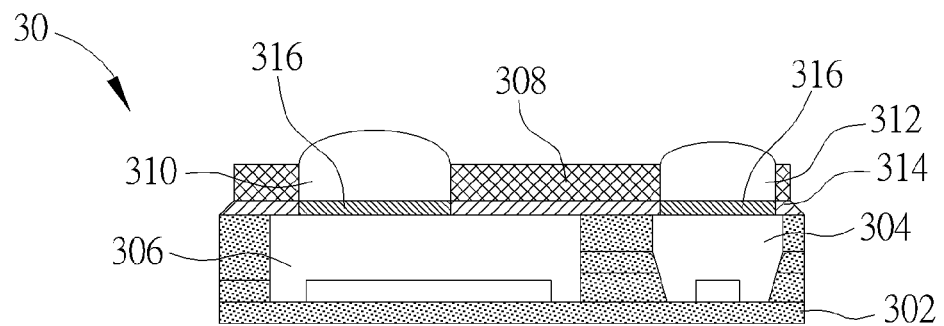
FIG. 3 is a side view diagram of another motion sensor according to an embodiment of the present invention.

In an embodiment, the lens may be inserted in the cover to form a complete cover by double injection molding, so it can be overlaid on the motion sensor. FIG. 3 is a side view diagram of another motion sensor 30 according to an embodiment of the present invention. The motion sensor 30 includes a substrate 302, a light source 304, a sensing device 306, a cover 308 and lenses 310, 312. The materials and components of the substrate 302, the light source 304 and the sensing device 306 are similar to those of the substrate 102, the light source 104 and the sensing device 106, respectively, and thus will not be detailed further herein. The cover 308 and the lenses 310, 312 are laid over the substrate 302 by double injection molding. The materials of the cover 308 may be ceramics or related compounds, which are glued to the substrate 302 via an adhesive 314 capable of blocking the light emitted by the light source 304 and light of the same wavelength. The lenses 310 and 312 are glued to the light source 304 and the sensing device 306 via an optically clear adhesive 316 that is able to pass light emitted by the light source 304. Similar to the adhesives used for the lens of FIGS. 2A and 2B, the optically clear adhesive 316 may be realized by any adhesive transparent to light such as silicone, epoxy or ultraviolet curable adhesive.

Please note that the present invention provides a motion sensor having a ceramic package structure and a packaging method thereof. Those skilled in the art can make modifications or alternations accordingly. For example, the packaging method of a motion sensor may be a ball grid array (BGA) packaging technology, or the chip scale package (CSP) technology may be incorporated in order to reduce package size. In the above embodiments the lenses are plastic lenses glued to the light source or the sensing device, but in an embodiment, a wafer level lens may be applied for a sensing device, in order to reduce cost and enhance production efficiency.

Figure 4A:
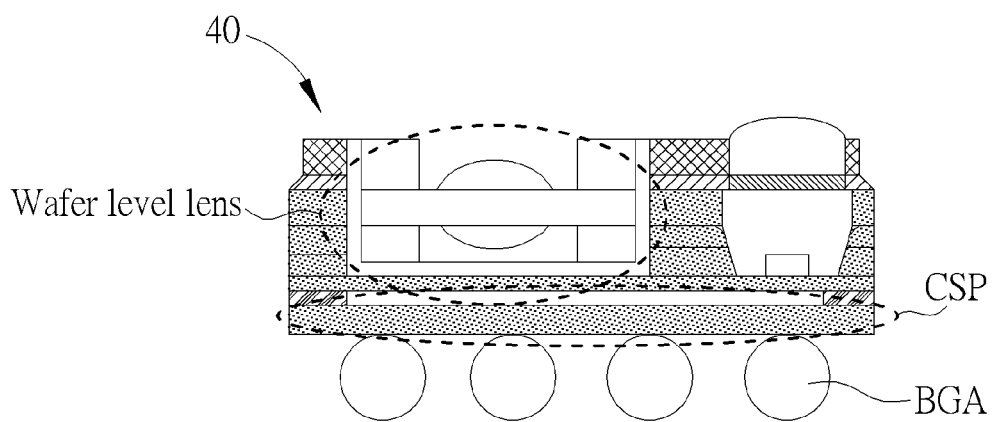
FIG. 4A and FIG. 4B are a side view and bottom view, respectively, of a motion sensor according to an embodiment of the present invention.
Figure 4B:
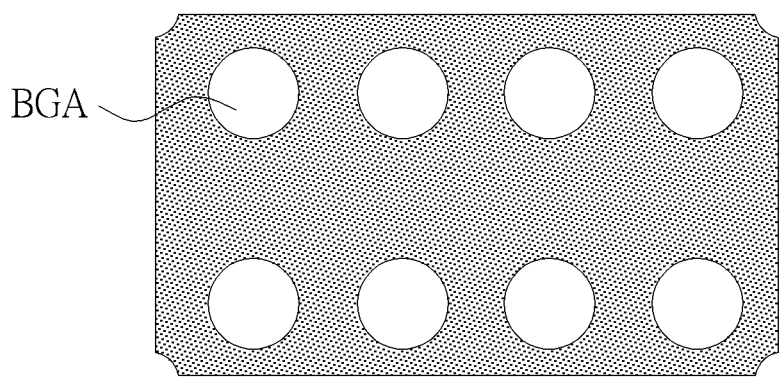

Please refer to FIG. 4A and FIG. 4B, which are a side view and bottom view, respectively, of a motion sensor 40 according to an embodiment of the present invention. As shown in FIG. 4A, the structure and element disposition of the motion sensor 40 are similar to the motion sensor 10. The main difference between the motion sensor 40 and the motion sensor 10 is that the motion sensor 40 uses a wafer level lens as the medium for the sensing device to receive light. CSP technology is applied in the motion sensor 40 and incorporated with the BGA package to achieve a smaller package area.

Figure 5:
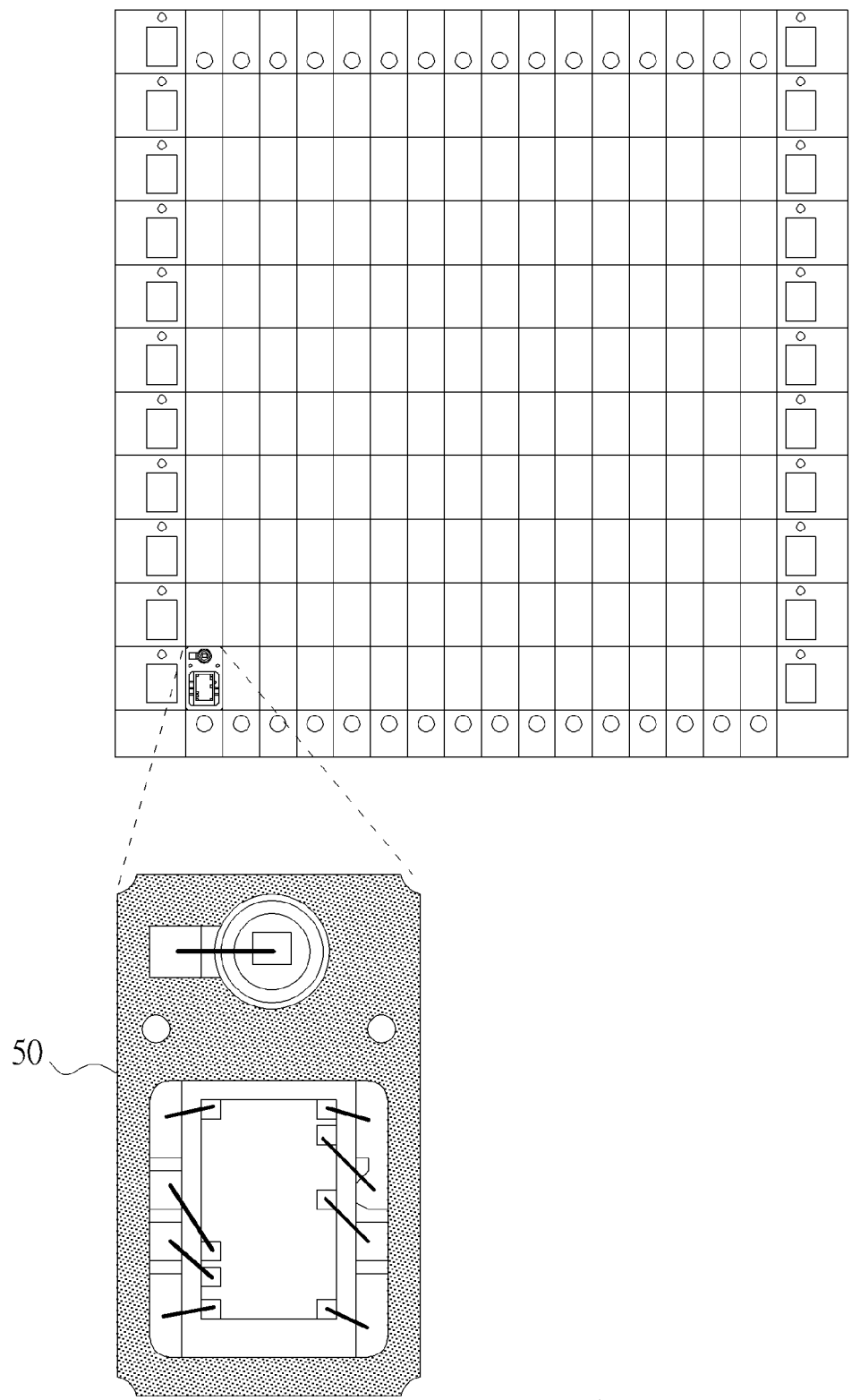
FIG. 5 is a schematic diagram of a plurality of motion sensors according to an embodiment of the present invention.

In the above embodiments, the structure and packaging method are all illustrated with a single motion sensor. In general, when manufacturing the package of the motion sensor, the manufacturer lays each layer of the packaging material individually. Multiple packages are manufactured simultaneously and segmented to each individual package. FIG. 5 is a schematic diagram of a plurality of motion sensors according to an embodiment of the present invention. When the motion sensor is packaged, the substrate is first constructed by laying a plurality of lead frame layers and a plurality of ceramic layers, and the light source and the sensing device are placed in the substrate individually. A layer of adhesive is then laid on the package, in order to fix and protect the light source and the sensing device. The package is finally covered by the cover and lenses. In FIG. 5, each grid is a system in package, which can be divided into a respective motion sensor 50.

Figure 6:
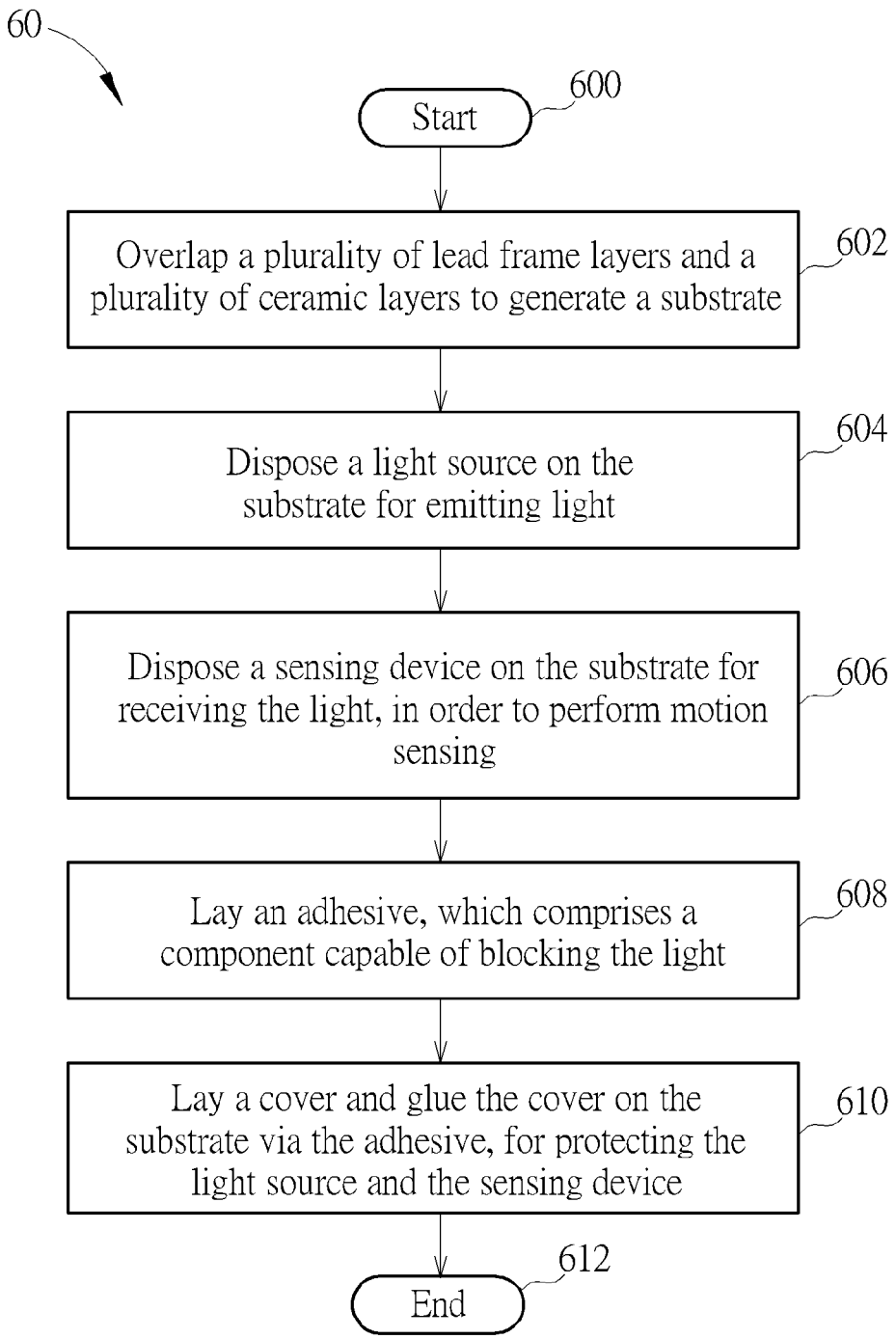
FIG. 6 is a schematic diagram of a packaging process according to an embodiment of the present invention.

The abovementioned packaging method of the motion sensor can be summarized into a packaging process 60, which is shown in FIG. 6. The packaging process 60 includes the following steps:

Step 600: Start.

Step 602: Overlap a plurality of lead frame layers and a plurality of ceramic layers to generate a substrate.

Step 604: Dispose a light source on the substrate for emitting light.

Step 606: Dispose a sensing device on the substrate for receiving the light, in order to perform motion sensing.

Step 608: Lay an adhesive, which comprises a component capable of blocking the light.

Step 610: Lay a cover and glue the cover on the substrate via the adhesive, for protecting the light source and the sensing device.

Step 612: End.

To sum up, the present invention provides a motion sensor having a ceramic package structure and a packaging method thereof, which can achieve high stability and conductivity. In some embodiments, double injection molding may be utilized for laying lenses and covers, which is further incorporated with package structures such as CSP and BGA package, in order to reduce package area and enhance manufacturing efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A motion sensor, comprising:
    a substrate, comprising a plurality of lead frame layers and a plurality of ceramic layers, wherein the plurality of lead frame layers and the plurality of ceramic layers overlap in an interleaved manner;
    a light source, disposed on the substrate, for emitting light;
    a sensing device, disposed on the substrate, for receiving the light to perform motion sensing;
    a cover, for fixing and protecting the light source and the sensing device; and
    an adhesive, for gluing the cover to the substrate, the adhesive comprising a component capable of blocking the light;
    wherein the light is infrared light, visible light or ultraviolet light.

2. The motion sensor of claim 1, wherein the cover is a ceramic compound, overlaid on the substrate, and a hole is formed over the light source and the sensing device in order to allow the light to pass.

3. The motion sensor of claim 1, wherein the cover is overlaid on the substrate by double injection molding.

4. The motion sensor of claim 1, wherein the cover comprises:
    a ceramic compound, overlaid on the substrate;
    a first lens, placed over the light source, for protecting the light source and allowing the light to pass; and
    a second lens, placed over the sensing device, for protecting the sensing device and allowing the light to pass.

5. The motion sensor of claim 4, wherein the first lens is a plastic lens.

6. The motion sensor of claim 4, wherein the second lens is a plastic lens or a wafer level lens.

7. The motion sensor of claim 4, wherein the first lens and the second lens are glued to the light source and the sensing device, respectively, via a silicone, an epoxy or an ultraviolet curable adhesive.

8. The motion sensor of claim 1, further comprising a driver, for driving operations of the light source.

9. The motion sensor of claim 1, wherein the sensing device is realized in a chip, and the chip is disposed on the substrate via a chip scale package (CSP).

10. A packaging method for a motion sensor, comprising:
    laying a plurality of lead frame layers and a plurality of ceramic layers in an interleaved manner to generate a substrate;
    disposing a light source on the substrate for emitting light;
    disposing a sensing device on the substrate for receiving the light to perform motion sensing;
    laying an adhesive, the adhesive comprising a component capable of blocking the light; and
    overlaying a cover and gluing the cover to the substrate via the adhesive, for protecting the light source and the sensing device;
    wherein the light is infrared light, visible light or ultraviolet light.

11. The packaging method of claim 10, wherein the step of overlaying the cover and gluing the cover to the substrate via the adhesive for protecting the light source and the sensing device comprises:
    overlaying a ceramic compound on the substrate as the cover, wherein a hole is formed over the light source and the sensing device in order to allow the light to pass.

12. The packaging method of claim 10, wherein the cover is overlaid on the substrate by double injection molding.

13. The packaging method of claim 10, wherein the step of overlaying the cover and gluing the cover to the substrate via the adhesive for protecting the light source and the sensing device comprises:
    overlaying a ceramic compound on the substrate;
    placing a first lens over the light source, for protecting the light source and allowing the light to pass; and
    placing a second lens over the sensing device, for protecting the sensing device and allowing the light to pass.

14. The packaging method of claim 13, wherein the first lens is a plastic lens.

15. The packaging method of claim 13, wherein the second lens is a plastic lens or a wafer level lens.

16. The packaging method of claim 13, wherein the first lens and the second lens are glued to the light source and the sensing device, respectively, via a silicone, an epoxy or an ultraviolet curable adhesive.

17. The packaging method of claim 10, further comprising driving operations of the light source.

18. The packaging method of claim 10, wherein the sensing device is realized in a chip, and the chip is disposed on the substrate via a chip scale package (CSP).

* * * * *